United States Patent
Xiang et al.

(10) Patent No.: US 6,872,613 B1
(45) Date of Patent: Mar. 29, 2005

(54) METHOD FOR INTEGRATING METALS HAVING DIFFERENT WORK FUNCTIONS TO FORM CMOS GATES HAVING A HIGH-K GATE DIELECTRIC AND RELATED STRUCTURE

(75) Inventors: Qi Xiang, San Jose, CA (US); Huicai Zhong, Wappinger Falls, NY (US); Jung-Suk Goo, Stanford, CA (US); Allison K. Holbrook, San Jose, CA (US); Joong S. Jeon, Cupertino, CA (US); George J. Kluth, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/654,689

(22) Filed: Sep. 4, 2003

(51) Int. Cl.⁷ .......................................... H01L 21/8238

(52) U.S. Cl. ...................................... 438/199; 257/369

(58) Field of Search .................................. 257/369, 410, 257/411, 407; 438/199

(56) References Cited

U.S. PATENT DOCUMENTS 6,027,961 A * 2/2000 Maiti et al. ................. 438/199
6,492,217 B1 * 12/2002 Bai et al. .................... 438/199

* cited by examiner

Primary Examiner—David Nelms
Assistant Examiner—David Vu
(74) Attorney, Agent, or Firm—Farjami & Farjami LLP (57) ABSTRACT

According to one exemplary embodiment, a method for integrating first and second metal layers on a substrate to form a dual metal NMOS gate and PMOS gate comprises depositing a dielectric layer over an NMOS region and a PMOS region of the substrate. The method further comprises depositing the first metal layer over dielectric layer. The method further comprises depositing the second metal layer over the first metal layer. The method further comprises implanting nitrogen in the NMOS region of substrate and converting a first portion of the first metal layer into a metal oxide layer and converting a second portion of the first metal layer into metal nitride layer. The method further comprises forming the NMOS gate and the PMOS gate, where the NMOS gate comprises a segment of metal nitride layer and the PMOS gate comprises a segment of the metal oxide layer.

25 Claims, 6 Drawing Sheets

METHOD FOR INTEGRATING METALS HAVING DIFFERENT WORK FUNCTIONS TO FORM CMOS GATES HAVING A HIGH-K GATE DIELECTRIC AND RELATED STRUCTURE

TECHNICAL FIELD

The present invention is generally in the field of semiconductor devices. More particularly, the present invention is in the field of fabrication of complementary metal-oxide semiconductor ("CMOS") transistors.

BACKGROUND ART

Gate dielectrics having a high dielectric constant ("high-k") and metal gate electrodes can be utilized by semiconductor manufacturers to improve the performance of complementary metal-oxide semiconductor ("CMOS") transistors. High-k gate dielectrics are desirable in small feature size technologies since conventional gate dielectrics, such as $SiO_2$, are too thin and they result in high tunneling current, as well as other problems. Further, metal gate electrodes can replace polysilicon gate electrodes, which diminish NFET and PFET transistor performance due to, for example, having a high resistance and also causing undesirable depletion of carriers at the interface between gate dielectric and channel. However, NMOS transistors require a metal gate electrode having a work function of, for example, approximately 4.1 eV while PMOS transistors require a metal gate electrode having a higher work function of, for example, approximately 5.1 eV. Thus, semiconductor manufacturers are challenged to integrate metals having different work functions and high-k gate dielectrics in a fabrication process to effectively achieve dual metal NMOS and PMOS gates.

In a conventional fabrication process for CMOS transistors utilizing metal gate electrodes and high-k gate dielectrics, a first metal layer having a suitable work function for an NMOS gate and a gate dielectric layer comprising a high-k dielectric are typically deposited over NMOS and PMOS regions of a semiconductor die substrate. Since gate electrodes for NMOS and PMOS gates require different work functions, the first metal layer would not be suitable to form PMOS gate electrodes. Also, current high-k dielectric deposition processes typically cause a high concentration of negative charge to form in the high-k dielectric layer in the PMOS region, which causes an undesirable shift in gate threshold voltage and degradation of carrier mobility. Thus, in a conventional process, different metal layers must be provided in the NMOS and PMOS regions to form respective NMOS and PMOS gate electrodes.

Thus, in the conventional fabrication process, portions of the first metal layer situated in the PMOS region of the substrate are removed and a second metal layer having a work function for the PMOS gates is deposited over the gate dielectric layer in the PMOS region. Thus, the conventional process for fabricating dual metal CMOS gates discussed above is a difficult process that requires depositing a first metal layer over NMOS and PMOS regions of a substrate, removing portions of the first metal layer in the PMOS region, and depositing a second metal layer in the PMOS region.

Thus, there is a need in the art for an effective method for integrating two metals having different work functions to form dual metal CMOS gates having a high-k gate dielectric.

SUMMARY

The present invention is directed to method for integrating metals having different work functions to form CMOS gates having a high-k gate dielectric and related structure. The present invention addresses and resolves the need in the art for an effective method for integrating two metals having different work functions to form dual metal CMOS gates having a high-k gate dielectric.

According to one exemplary embodiment, a method for integrating a first metal layer and a second metal layer on a substrate to form a dual metal NMOS and PMOS gate comprises a step of depositing a dielectric layer over an NMOS and a PMOS region of the substrate. The dielectric layer can be, for example, hafnium oxide, zirconium oxide, zirconium silicate, or hafnium oxide. The method further comprises depositing the first metal layer over the dielectric layer. The first metal layer can be, for example, hafnium, zirconium, or tantalum. The method further comprises depositing the second metal layer over the first metal layer. The second metal layer can be platinum, tungsten, nickel, or ruthenium, for example. The method further comprises implanting nitrogen in the NMOS region of the substrate.

According to this exemplary embodiment, the method further comprises converting a first portion of the first metal layer to a metal oxide layer and converting a second portion of the first metal layer to a metal nitride layer. A high-temperature anneal is utilized to convert the first portion of the first metal layer into the metal oxide layer and to complete conversion of the second portion of the first metal layer into the metal nitride layer. The method can further comprise implanting a P type dopant in the PMOS region of the substrate. The method further comprises forming the NMOS and the PMOS gate, where the NMOS gate comprises a segment of the metal nitride layer and the PMOS gate comprises a segment of the metal oxide layer. A gate electrode of the PMOS gate can be a segment of the second metal layer and a gate electrode of the NMOS gate can be the segment of the metal nitride layer. In one embodiment, the invention is a CMOS device fabricated by utilizing the above-discussed method. Other features and advantages of the present invention will become more readily apparent to those of ordinary skill in the art after reviewing the following detailed description and accompanying drawings.

DETAILED DESCRIPTION OF THE INVENTION

The present invention is directed to method for integrating metals having different work functions to form CMOS gates having a high-k gate dielectric and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

The present invention involves a process for effectively integrating different metal layers on a substrate of a semiconductor die to form dual metal NMOS and PMOS gates having a high-k gate dielectric. As will be discussed in detail below, the present invention achieves an innovative process whereby a first selective nitrogen implant and a high-temperature anneal are utilized to alter the composition and property of respective portions of a metal layer to achieve dual metal NMOS and PMOS gates and a second selective charge-balancing implant is utilized to balance charge in a PMOS gate dielectric stack.

Figure 1:
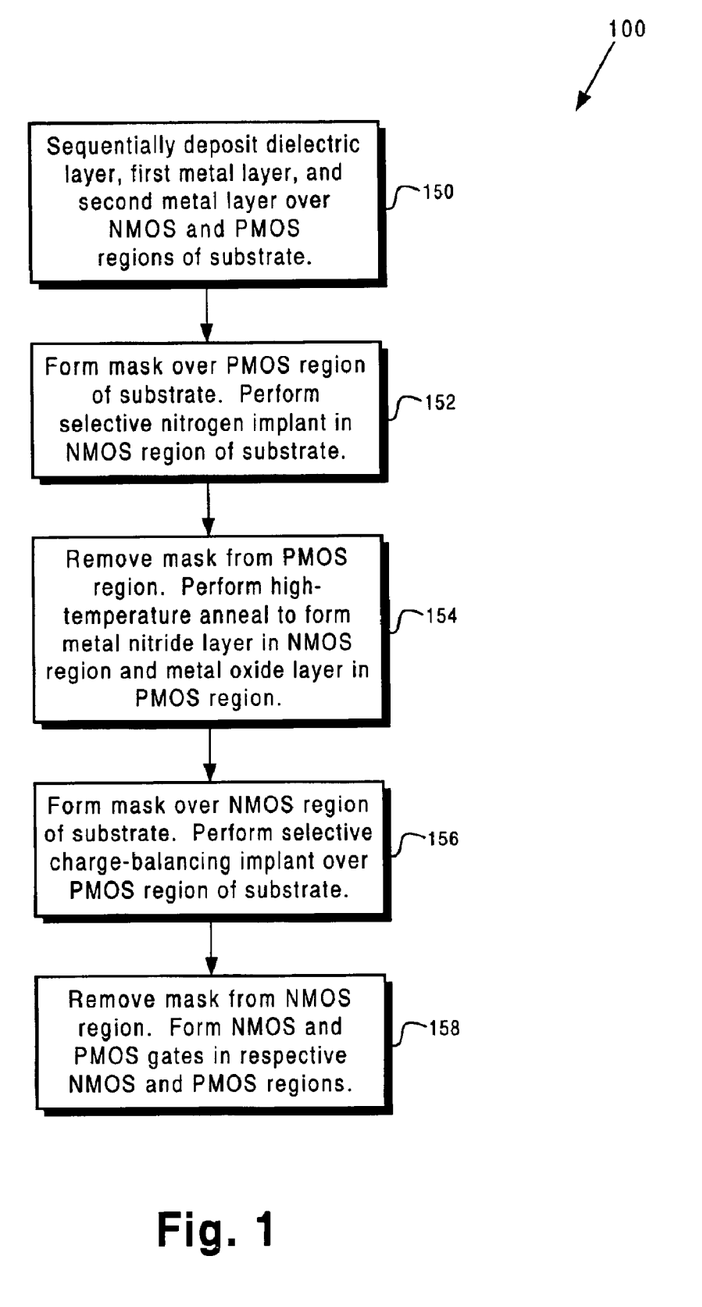
FIG. 1 is a flowchart corresponding to exemplary method steps according to one embodiment of the present invention.

FIG. 1 shows a flowchart illustrating an exemplary method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 150 through 158 indicated in flowchart 100 are sufficient to describe one embodiment of the present invention, other embodiments of the invention may utilize steps different from those shown in flowchart 100. It is noted that the processing steps shown in flowchart 100 are performed on a wafer, which, prior to step 150, includes a substrate having an NMOS region and a PMOS region.

Moreover, structures 250, 252, 254, 256, and 258 in FIGS. 2A, 2B, 2C, 2D, and 2E illustrate the result of performing, on a structure, such as a semiconductor die, including a substrate discussed above, steps 150, 152, 154, 156, and 158 of flowchart 100, respectively. For example, structure 250 shows the structure discussed above after processing step 150, structure 252 shows structure 250 after the processing of step 152, structure 254 shows structure 252 after the processing of step 154, and so forth.

Figure 2A:
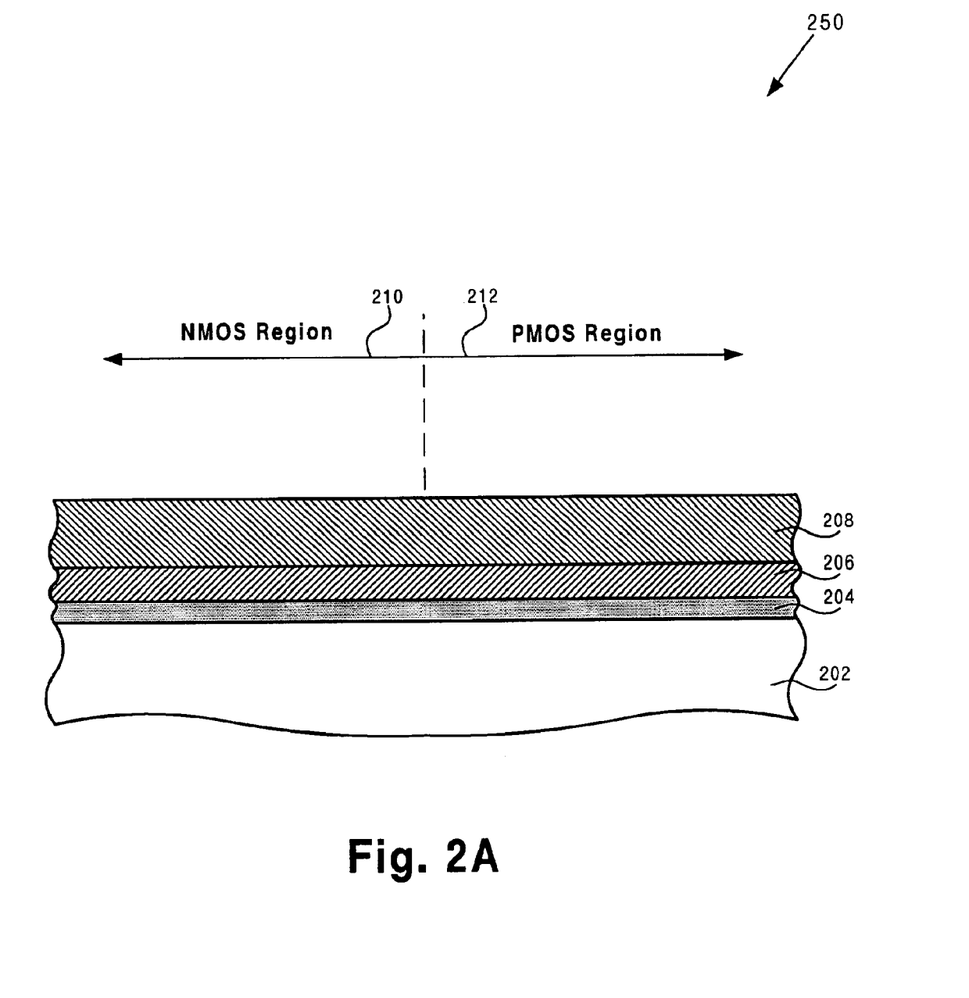
FIG. 2A illustrates a cross-sectional view of a portion of a wafer processed according to an embodiment of the invention, corresponding to certain steps of the flowchart in FIG. 1.

Referring now to step 150 in FIG. 1 and structure 250 in FIG. 2A, at step 150 of flowchart 100, dielectric layer 204, metal layer 206, and metal layer 208 are sequentially deposited over NMOS region 210 and PMOS region 212 of substrate 202. Substrate 202 can comprise N type doped silicon in PMOS region 212 and can comprise P type doped silicon in NMOS region 210. Dielectric layer 204 can comprise a dielectric having a high dielectric constant ("high-k dielectric"), such as hafnium oxide, zirconium oxide, zirconium silicate, or hafnium oxide, and may be deposited over substrate 202 utilizing a chemical vapor deposition ("CVD") process or other appropriate processes. By way of example, dielectric layer 204 can have a thickness less than 30.0 Angstroms.

Metal layer 206 can comprise hafnium, zirconium, or tantalum and can be deposited over dielectric layer 204 by CVD process or physical vapor deposition ("PVD") process or other appropriate processes. Metal layer 206 has a work function of approximately 4.1 eV, which is a desirable work function for an NMOS transistor gate. By way of example, metal layer 206 can have a thickness of between approximately 30.0 Angstroms and approximately 100.0 Angstroms. Metal layer 208 can comprise platinum, tungsten, cobalt, nickel, or ruthenium, and can be deposited over metal layer 206 by CVD process or PVD process or other appropriate processes. Metal layer 208 has a work function of approximately 5.1 eV, which is a desirable work function for a PMOS transistor gate. By way of example, metal layer 208 can have a thickness greater than 100.0 Angstroms. In one embodiment, a layer of polycrystalline silicon ("poly") (not shown in any of the figures) can be deposited over metal layer 208. In such embodiment, the layer of poly is N type doped in NMOS region 210 and P type doped in PMOS region 212. In one embodiment, a layer of silicide (not shown in any of the figures) can be formed over metal layer 208. Referring to FIG. 2A, the result of step 150 of flowchart 100 is illustrated by structure 250.

Figure 2B:
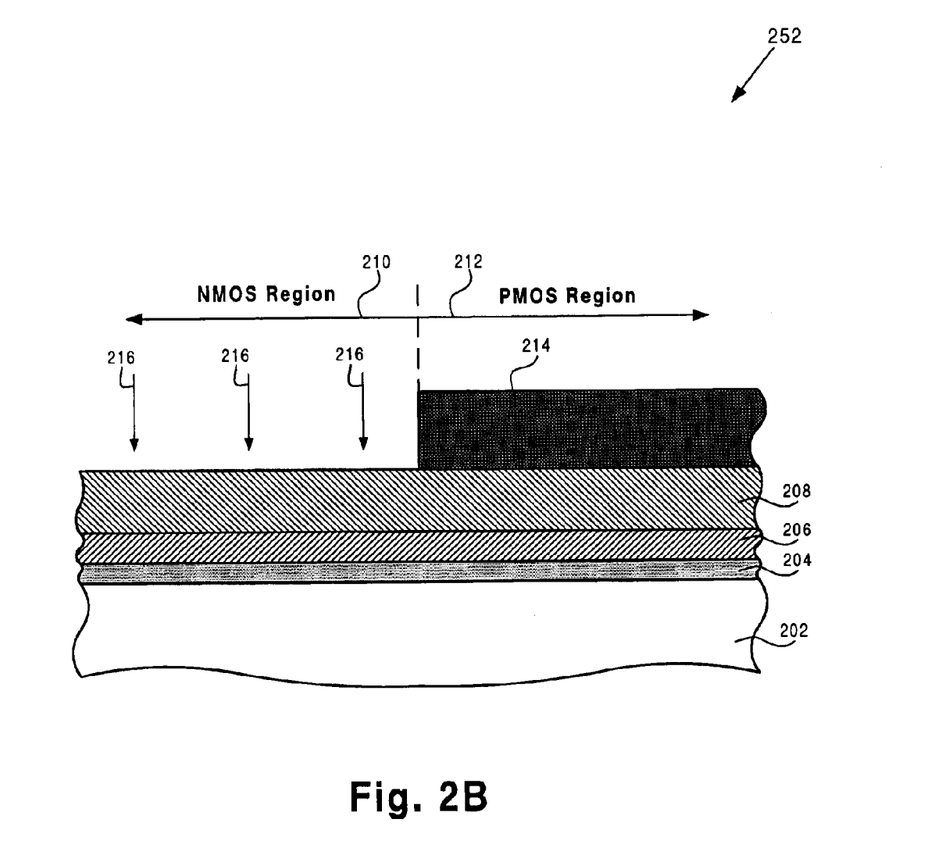
FIG. 2B illustrates a cross-sectional view of a portion of a wafer processed according to an embodiment of the invention, corresponding to certain steps of the flowchart in FIG. 1.

Continuing with step 152 in FIG. 1 and structure 252 in FIG. 2B, at step 152 of flowchart 100, mask 214 is formed over PMOS region 212 of substrate 202. Mask 214 can comprise photoresist or other appropriate material as known in the art. Mask 214 is formed only over PMOS region 212, leaving NMOS region 210 unmasked. Next, selective nitrogen implant 216 is performed over NMOS region 210. In the present embodiment, nitrogen implant 216 is adjusted such that nitrogen is selectively implanted in metal layer 206 while passing through metal layer 208. As a result of nitrogen implant 216, a concentration of nitrogen implanted in metal layer 206 is higher than a concentration of nitrogen implanted in metal layer 208. Referring to FIG. 2B, the result of step 152 of flowchart 100 is illustrated by structure 252.

Figure 2C:
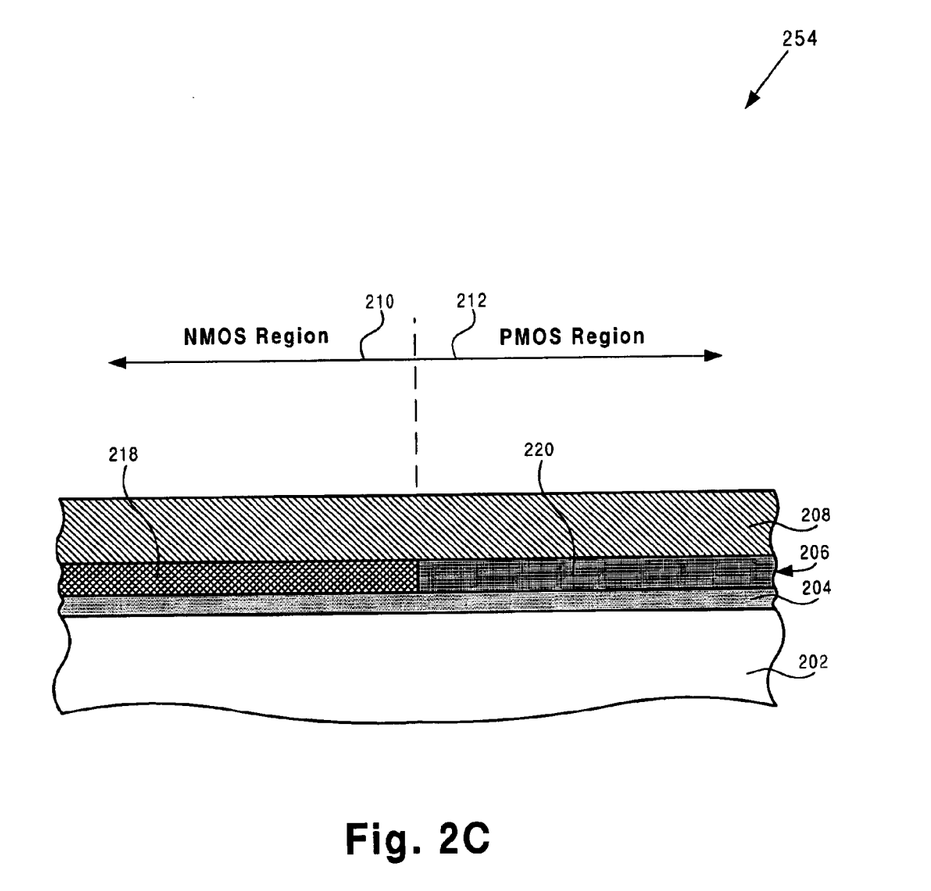
FIG. 2C illustrates a cross-sectional view of a portion of a wafer processed according to an embodiment of the invention, corresponding to certain steps of the flowchart in FIG. 1.

Continuing with step 154 in FIG. 1 and structure 254 in FIG. 2C, at step 154 of flowchart 100, mask 214 is removed from PMOS region 212 and a high-temperature anneal is performed to form metal nitride layer 218 in NMOS region 210 and metal oxide layer 220 in PMOS region 212. Mask 214 may be removed by, for example, utilizing a plasma etch or other appropriate etch as known in the art. As a result of performing the high-temperature anneal, a portion of metal layer 206 situated in NMOS region 210 is converted into metal nitride to form metal nitride layer 218 (also referred to as a "nitride converted" portion in the present application) and a portion of metal layer 206 situated in PMOS region 212 is converted into metal oxide to form metal oxide layer 220 (also referred to as an "oxide converted" portion in the present application). The metal nitride layer 218 provides an appropriate work function for NMOS transistor gates. A segment of metal oxide layer 220 will be utilized to form a PMOS gate dielectric stack in a subsequent process step.

When the portion of metal layer 206 in PMOS region 212 is converted into metal oxide during the high-temperature anneal, the portion of metal layer 206 is effectively converted into a dielectric. Thus, the high-temperature anneal alters the composition and property of a portion of metal layer 206 situated in PMOS region 212 by converting it into a metal oxide, which is a dielectric. As a result, when a PMOS gate is formed in PMOS region 212 in a subsequent process step, metal layer 208 becomes a PMOS gate electrode in the PMOS gate. Referring to FIG. 2C, the result of step 154 of flowchart 100 is illustrated by structure 254.

Figure 2D:
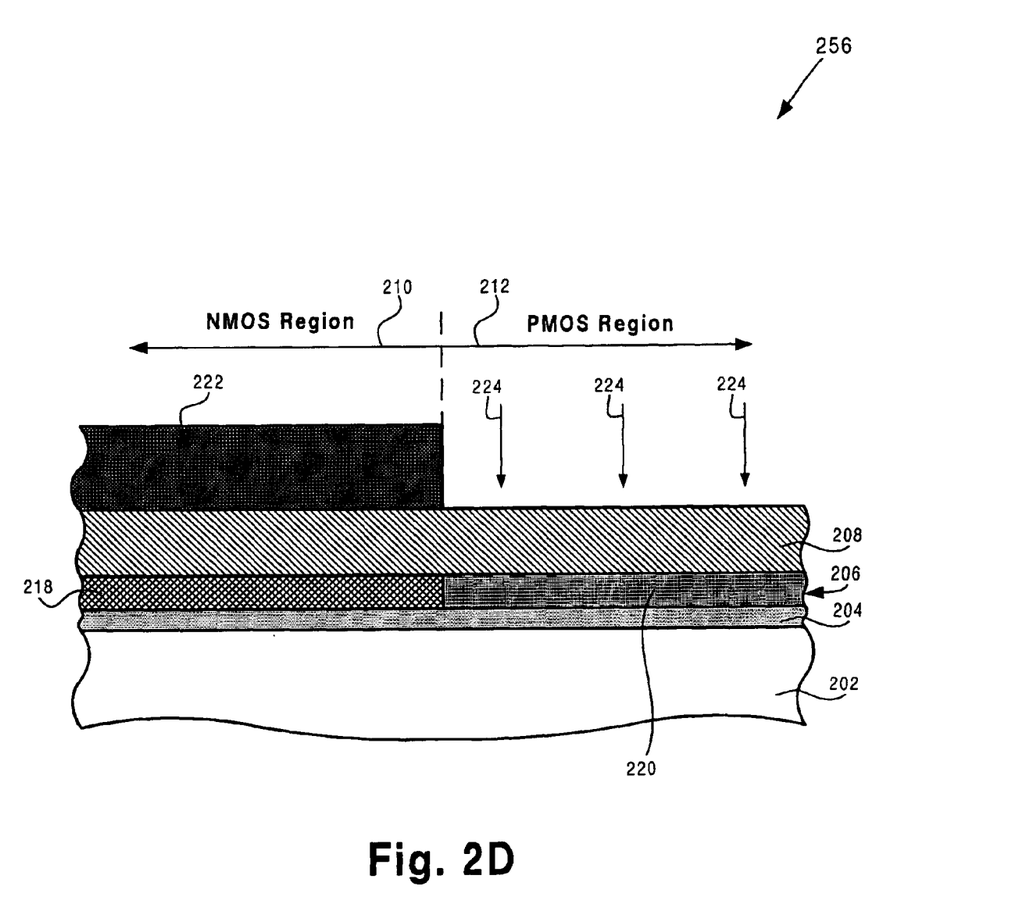
FIG. 2D illustrates a cross-sectional view of a portion of a wafer processed according to an embodiment of the invention, corresponding to certain steps of the flowchart in FIG. 1.

Continuing with step 156 in FIG. 1 and structure 256 in FIG. 2D, at step 156 of flowchart 100, mask 222 is formed over NMOS region 210 of substrate 202. Similar to mask 214, mask 222 can comprise photoresist or other appropriate material as known in the art. Mask 222 is formed only over NMOS region 210, leaving PMOS region 212 unmasked. Next, selective charge-balancing implant 224 is performed in PMOS region 212. In selective charge-balancing implant 224, a P type dopant such as argon or other appropriate dopant is implanted in metal oxide layer 220 in PMOS region 212. In the present invention, a balanced charge is achieved by utilizing selective charge-balancing implant 224 to introduce an appropriate positive charge into metal oxide layer 220 to neutralize negative charge in metal oxide layer 220 and a portion of dielectric layer 204 situated in PMOS region 212. As a result, the present invention advantageously prevents an undesirable threshold voltage shift and undesirable carrier mobility degradation in a subsequently formed PMOS gate caused by negative charge in the PMOS gate dielectric stack comprising metal oxide layer 220 and dielectric layer 204. Referring to FIG. 2D, the result of step 156 of flowchart 100 is illustrated by structure 256.

Figure 2E:
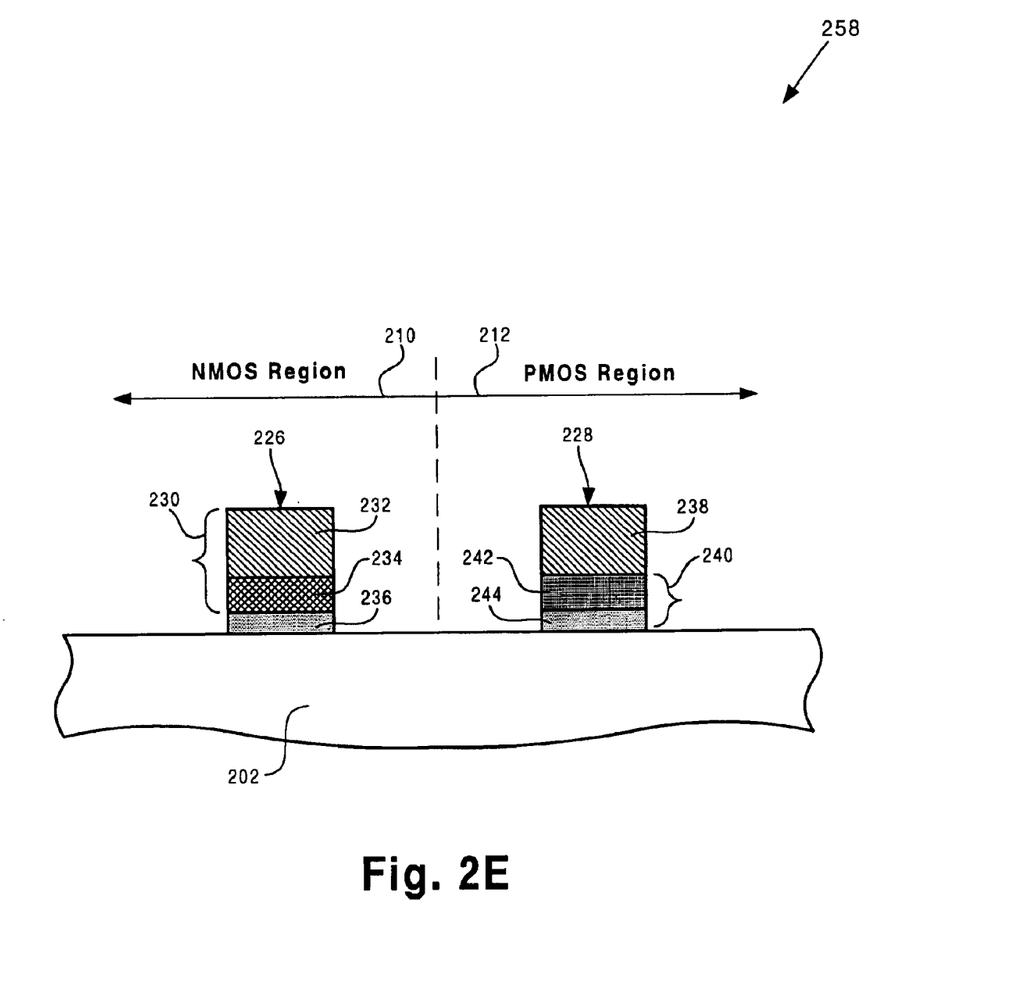
FIG. 2E illustrates a cross-sectional view of a portion of a wafer processed according to an embodiment of the invention, corresponding to certain steps of the flowchart in FIG. 1.

Continuing with step 158 in FIG. 1 and structure 258 in FIG. 2E, at step 158 of flowchart 100, mask 222 is removed from NMOS region 210 of substrate 202. It is noted that structure 258 is also referred to as a "CMOS structure" in the present application. Mask 222 may be removed in a similar manner as mask 214 discussed above. Next, NMOS gate 226 and PMOS gate 228 are formed in NMOS region 210 and PMOS region 212, respectively. NMOS gate 226 can be formed by patterning and etching metal layer 208, metal nitride layer 218, and dielectric layer 204 situated in NMOS region 210 in a manner known in the art. Similarly, PMOS gate 228 can be formed by patterning and etching metal layer 208, metal oxide layer 220, and dielectric layer 204 situated in PMOS region 212.

NMOS gate 226 includes gate electrode stack 230, which comprises segment 232 of metal layer 208 and segment 234 of metal nitride layer 218, and a gate dielectric, which comprises segment 236 of dielectric layer 204. The work function of gate electrode stack 230 of NMOS gate 226 is determined by portion 234 of metal nitride layer 218. In other embodiments, gate electrode stack 230 can comprise either a poly layer or a silicide layer situated over segment 232 of metal layer 208. PMOS gate 228 includes gate electrode 238, which comprises segment 238 of metal layer 208, and gate dielectric stack 240, which comprises segment 242 of metal oxide layer 220 and segment 244 of dielectric layer 204. The work function of gate electrode 238 of PMOS gate 228 is determined by metal layer 208. In other embodiments, PMOS gate 228 can include a gate electrode stack comprising either a poly layer or a silicide layer situated over segment 238 of metal layer 208. It is noted that although only NMOS gate 226 and PMOS gate 228 are shown in FIG. 2E to preserve brevity, NMOS region 210 and PMOS region 212 can include a large number of NMOS gates and PMOS gates, respectively. Referring to FIG. 2E, the result of step 158 of flowchart 100 is illustrated by structure 258.

As discussed above, by utilizing selective nitrogen and charge-balancing implants, the present invention advantageously achieves dual metal NMOS and PMOS gates having appropriate work functions and high-k gate dielectrics. As discussed above, after a selective nitrogen implant is performed in an NMOS region of a substrate, a high-temperature anneal is utilized to advantageously convert a portion of metal layer 206 into a layer of metal nitride, which is utilized, in combination with a segment of metal layer 208, to form an NMOS gate electrode stack. The high-temperature anneal is also utilized, as discussed above, to convert a portion of metal layer 206 into a layer of metal oxide, which is utilized in combination with a segment of dielectric layer 204 to form a PMOS gate dielectric stack. The present invention also utilizes a selective charge-balancing implant to neutralize excessive negative charge in a PMOS gate dielectric stack, i.e. gate dielectric stack 240, which advantageously prevents undesirable gate threshold voltage shift and carrier mobility degradation in the PMOS gate stack.

Additionally, by utilizing the same metal layers, i.e. metal layers 206 and 208, in an NMOS region and a PMOS region of a substrate, the present invention advantageously achieves an effective integration of different metal layers, i.e. metal layers 206 and 208, to achieve dual metal CMOS, i.e. NMOS and PMOS, gates. In contrast, in a conventional dual metal CMOS gate fabrication process, dual metal CMOS gates are fabricated in a process requiring separate deposition of gate metal in NMOS and PMOS regions, which is difficult to implement effectively.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, method for integrating metals having different work functions to form CMOS gates having a high-k gate dielectric and related structure have been described.

What is claimed is:

1. A method comprising steps of:
   depositing a dielectric layer over an NMOS region and a PMOS region of a substrate;
   depositing a first metal layer over said dielectric layer;
   implanting nitrogen in said NMOS region of said substrate;
   converting a first portion of said first metal layer into a metal oxide layer and converting a second portion of said first metal layer into a metal nitride layer;
   forming an NMOS gate and a PMOS gate, said NMOS gate comprising a segment of said metal nitride layer and said PMOS gate comprising a segment of said metal oxide layer.

2. The method of claim 1 wherein said step of converting said first portion of said first metal layer into said metal oxide layer comprises utilizing a high-temperature anneal.

3. The method of claim 1 further comprising a step of implanting a P type dopant in said PMOS region of said substrate after said step of converting said first portion of said first metal layer and prior to said step of forming said NMOS gate and said PMOS gate.

4. The method of claim 1 further comprising a step of depositing a second metal layer over said first metal layer after said step of depositing said first metal layer and prior to said step of implanting said nitrogen in said NMOS region.

5. The method of claim 1 wherein said step of implanting said nitrogen in said NMOS region comprises implanting said nitrogen in said second portion of said first metal layer without implanting said nitrogen in said first portion of said first metal layer.

6. The method of claim 4 wherein a gate electrode of said PMOS gate comprises a segment of said second metal layer and a gate electrode of said NMOS gate comprises said segment of said metal nitride layer.

7. The method of claim 1 wherein said first metal layer is selected from the group consisting of hafnium, zirconium, and tantalum.

8. The method of claim 1 wherein said dielectric layer is selected from the group consisting of hafnium oxide, zirconium oxide, zirconium silicate, and hafnium oxide.

9. A method comprising steps of depositing a dielectric layer over an NMOS region and a PMOS region of a substrate, depositing a first metal layer over said dielectric layer, said method being characterized by:
 implanting nitrogen in said NMOS region of said substrate, converting a first portion of said first metal layer into a metal oxide layer and converting a second portion of said first metal layer into a metal nitride layer, forming an NMOS gate and a PMOS gate, said NMOS gate comprising a segment of said metal nitride layer and said PMOS gate comprising a segment of said metal oxide layer.

10. The method of claim 9 wherein said step of converting said first portion of said first metal layer into said metal oxide layer comprises utilizing a high-temperature anneal.

11. The method of claim 9 further comprising a step of implanting a P type dopant in said PMOS region of said substrate after said step of converting said first portion of said first metal layer and prior to said step of forming said NMOS gate and said PMOS gate.

12. The method of claim 9 further comprising a step of depositing a second metal layer over said first metal layer after said step of depositing said first metal layer and prior to said step of implanting said nitrogen in said NMOS region.

13. The method of claim 9 wherein said step of implanting said nitrogen in said NMOS region comprises implanting said nitrogen in said second portion of said first metal layer without implanting said nitrogen in said first portion of said first metal layer.

14. The method of claim 12 wherein a gate electrode of said PMOS gate comprises a segment of said second metal layer and a gate electrode of said NMOS gate comprises said segment of said metal nitride layer.

15. The method of claim 9 wherein said first metal layer is selected from the group consisting of hafnium, zirconium, and tantalum.

16. A method comprising steps of:
 forming a dielectric layer over an NMOS region and a PMOS region of a substrate;
 forming a first metal layer over said dielectric layer;
 performing a first selective implant in said NMOS region of said substrate, said first selective implant comprising nitrogen;
 performing a high-temperature anneal, said high-temperature anneal causing a first portion of said first metal layer to be converted into a metal nitride layer and a second portion of said first metal layer to be converted into a metal oxide layer;
 performing a second selective implant in said PMOS region of said substrate, said second selective implant comprising a P type dopant;
 forming an NMOS gate in said NMOS region of said substrate and a PMOS gate in said PMOS region of said substrate, said NMOS gate comprising a gate electrode stack, said gate electrode stack comprising a segment of said metal nitride layer.

17. The method of claim 16 further comprising a step of depositing a second metal layer after said step of forming said first metal layer and prior to said step of performing said first selective implant.

18. The method of claim 17 wherein said PMOS gate comprises a gate electrode, said gate electrode comprising a segment of said second metal layer.

19. The method of claim 17 wherein said second metal layer is selected from the group consisting of platinum, tungsten, cobalt, nickel, and ruthenium.

20. The method of claim 16 wherein said step of performing said second implant comprises implanting said P type dopant in said metal oxide layer.

21. The method of claim 16 wherein said PMOS gate comprises a gate dielectric stack, said gate dielectric stack comprising a segment of said dielectric layer and a segment of said metal oxide layer.

22. The method of claim 16 wherein said P type dopant comprises argon.

23. The method of claim 16 wherein said step of performing said first selective implant in said NMOS region comprises implanting said nitrogen in said second portion of said first metal layer without implanting said nitrogen in said first portion of said first metal layer.

24. The method of claim 16 wherein said dielectric layer is selected from the group consisting of hafnium oxide, zirconium oxide, zirconium silicate, and hafnium oxide.

25. The method of claim 16 wherein said first metal layer is selected from the group consisting of hafnium, zirconium, and tantalum.

* * * * *